US012387810B2

(12) United States Patent
Kim et al.

(10) Patent No.: US 12,387,810 B2
(45) Date of Patent: Aug. 12, 2025

(54) MEMORY DEVICES AND ELECTRONIC DEVICES OUTPUTTING EVENT DATA RELATED TO OCCURRENCES OF ERRORS AND OPERATING METHODS OF MEMORY DEVICES

(71) Applicant: Samsung Electronics Co., Ltd., Suwon-si (KR)

(72) Inventors: Byeongho Kim, Suwon-si (KR); Shinhaeng Kang, Suwon-si (KR); Suk Han Lee, Suwon-si (KR); Hweesoo Kim, Suwon-si (KR); Kyomin Sohn, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 91 days.

(21) Appl. No.: 18/362,130

(22) Filed: Jul. 31, 2023

(65) Prior Publication Data

US 2024/0161850 A1   May 16, 2024

(30) Foreign Application Priority Data

Nov. 11, 2022   (KR) .......................... 10-2022-0150784

(51) Int. Cl.
*G11C 29/18* (2006.01)
*G11C 29/12* (2006.01)

(52) U.S. Cl.
CPC .......... *G11C 29/18* (2013.01); *G11C 29/1201* (2013.01); *G11C 2029/1202* (2013.01); *G11C 2029/1204* (2013.01)

(58) Field of Classification Search
None
See application file for complete search history.

(56) References Cited

U.S. PATENT DOCUMENTS

| 6,978,343 B1 * | 12/2005 | Ichiriu ................... G11C 15/00 365/49.1 |
| 10,884,848 B2 | 1/2021 | Chung et al. |
| 11,043,259 B2 | 6/2021 | Wentzlaff et al. |
| 11,182,242 B2 | 11/2021 | Chauhan et al. |
| 11,188,406 B1 | 11/2021 | Alsop et al. |
| 11,237,903 B2 | 2/2022 | Sundaram et al. |

(Continued)

FOREIGN PATENT DOCUMENTS

KR       20220031793 A       3/2022

*Primary Examiner* — Guerrier Merant
(74) *Attorney, Agent, or Firm* — Myers Bigel, P.A.

(57) ABSTRACT

A memory device which includes a plurality of memory chips. Each of the plurality of memory chips includes a plurality of memory banks and a logic circuit performing a read operation on data stored in the plurality of memory banks based on a first command and a first address received from a host. When a PIM instruction set is stored before the first command and the first address are received, the logic circuit is configured to perform a PIM command execution operation. When an error associated with the PIM command execution operation occurs, the logic circuit is configured to generate error data and record the error data at the log register through the first channels. The logic circuit is configured to output event data indicating an existence of the error data to the host in a first operation mode. The logic circuit is configured to output the error data to the host in a second operation mode.

20 Claims, 12 Drawing Sheets

(56) References Cited

U.S. PATENT DOCUMENTS

| | | |
|---|---|---|
| 11,237,907 B2 | 2/2022 | Chiang |
| 11,301,167 B2 | 4/2022 | Khan et al. |
| 11,462,255 B2 | 10/2022 | Kwon et al. |
| 2015/0067444 A1* | 3/2015 | Eguchi ................ G06F 11/1048 714/766 |
| 2021/0194508 A1* | 6/2021 | Kim .................... G06F 11/1048 |

* cited by examiner

FIG. 9

| Error Type | Pin | Burst Position | | | | | | | |
|---|---|---|---|---|---|---|---|---|---|
| | | 0 | 1 | 2 | 3 | 4 | 5 | 6 | 7 |
| NE | SEV[0] | 0 | 0 | 0 | 0 | 0 | 0 | 0 | 0 |
| | SEV[1] | 0 | 0 | 0 | 0 | 0 | 0 | 0 | 0 |
| CE | SEV[0] | 0 | 0 | 0 | 0 | 1 | 1 | 1 | 1 |
| | SEV[1] | 0 | 0 | 0 | 0 | 0 | 0 | 0 | 0 |
| CEm | SEV[0] | 0 | 0 | 0 | 0 | 1 | 1 | 1 | 1 |
| | SEV[1] | 0 | 0 | 0 | 0 | 1 | 1 | 1 | 1 |
| UE | SEV[0] | 0 | 0 | 0 | 0 | 0 | 0 | 0 | 0 |
| | SEV[1] | 0 | 0 | 0 | 0 | 1 | 1 | 1 | 1 |
| PIM Load UECC | SEV[0] | 1 | 1 | 1 | 1 | 0 | 0 | 0 | 0 |
| | SEV[1] | 1 | 1 | 1 | 1 | 1 | 1 | 1 | 1 |
| ADER | SEV[0] | 1 | 1 | 1 | 1 | 1 | 1 | 1 | 1 |
| | SEV[1] | 1 | 1 | 1 | 1 | 0 | 0 | 0 | 0 |
| H/W Error | SEV[0] | 1 | 1 | 1 | 1 | 1 | 1 | 1 | 1 |
| | SEV[1] | 1 | 1 | 1 | 1 | 1 | 1 | 1 | 1 |

MEMORY DEVICES AND ELECTRONIC DEVICES OUTPUTTING EVENT DATA RELATED TO OCCURRENCES OF ERRORS AND OPERATING METHODS OF MEMORY DEVICES

CROSS-REFERENCE TO RELATED APPLICATIONS

This application claims priority under 35 U.S.C. § 119 to Korean Patent Application No. 10-2022-0150784 filed on Nov. 11, 2022, in the Korean Intellectual Property Office, the disclosures of which are incorporated by reference herein in their entireties.

TECHNICAL FIELD

Aspects of the present disclosure relate to semiconductor devices, and more particularly, relate to memory devices and electronic devices configured to output event data related to errors occurring when performing in-memory processing, and to operating methods of the memory devices.

BACKGROUND

A random-access memory includes an error correction code block. The error correction code block performs error correction on data while a read operation, which may be a part of a processing in memory (PIM) operation, is performed on data recorded at memory cells. However, the error correction code block may fail in or during the error correction for the data. In response to the error correction fail code, the random-access memory notifies a central processing unit that an error occurs or has occurred during the PIM operation. In this case, the central processing unit may fail to recognize quickly the error occurring during the PIM operation.

In addition, when the PIM operation is performed in the random-access memory, various types of errors may occur. In this case, the central processing unit may fail to recognize quickly various types of errors. Accordingly, there is research into methods to report an error to the central processing unit quickly.

SUMMARY

Aspects of the present disclosure provide memory devices and electronic devices for recording data related to errors occurring when performing in-memory processing and providing a host with event data indicating whether the error data exists through different schemes, and operating methods of the memory devices.

According to some embodiments, a memory device includes a plurality of memory chips. Each of the plurality of memory chips includes a plurality of memory banks, each of which includes a memory cell array including a plurality of memory cells connected with a plurality of word lines and a plurality of bit lines, a row decoder connected with the memory cell array through the plurality of word lines, a sense amplifier and write driver connected with the memory cell array through the plurality of bit lines, and a column decoder connected with the sense amplifier and write driver, a plurality of error correction code blocks that are respectively connected with the plurality of memory banks, a logic circuit that is connected with the plurality of error correction code blocks and performs a read operation on data stored in the plurality of memory banks based on a first command and a first address received from a host, and a log register that is connected with the logic circuit through first channels. When a processing in memory (PIM) instruction set is stored prior to receipt of the first command and the first address, the logic circuit is configured to perform a PIM command execution operation. When an error associated with the PIM command execution operation occurs, the logic circuit is configured to generate error data and record the error data at the log register through the first channels. In a first operation mode, the logic circuit is configured to output event data indicating an existence of the error data to the host through second channels in response to a second command and a second address. In a second operation mode, the logic circuit is configured to output the error data to the host through third channels in response to generation of the error data.

According to some embodiments, an operating method of a memory device which includes a plurality of memory chips each including a plurality of memory cells includes receiving, at a logic circuit included in a memory chip, a first command and a first address, generating, at the logic circuit, a processing in memory (PIM) address based on the first address, when a PIM instruction set is stored in the logic circuit before receiving the first command and the first address, performing, at the logic circuit, a PIM read operation on data of memory cells corresponding to the PIM address from among the plurality of memory cells, performing, at the logic circuit, a PIM calculation operation based on the data of the memory cells, generating, at the logic circuit, error data and recording the error data at a log register through first channels, when an error associated with at least one of the first address, the PIM read operation or the PIM calculation operation occurs, outputting, at the logic circuit, event data indicating an existence of the error data to the host through second channels in response to a second command and a second address, in a first operation mode, and outputting, at the logic circuit, the event data to the host through third channels in response to generating the error data, in a second operation mode.

According to some embodiments, an electronic device includes a plurality of memory devices, and a memory controller that receives a command and an address from an external host and configured to transfer the command and the address to the plurality of memory devices. Each of the plurality of memory devices includes a plurality of memory chips. Each of the plurality of memory chips includes a plurality of memory banks, each of which a memory cell array including a plurality of memory cells connected with a plurality of word lines and a plurality of bit lines, a row decoder connected with the memory cell array through the plurality of word lines, a sense amplifier and write driver connected with the memory cell array through the plurality of bit lines, and a column decoder connected with the sense amplifier and write driver, a plurality of error correction code blocks that are respectively connected with the plurality of memory banks, a logic circuit that is connected with the plurality of error correction code blocks and performs a read operation on data stored in the plurality of memory banks based on a first command and a first address received from the host, and a log register that is connected with the logic circuit through first channels. When a processing in memory (PIM) instruction set is stored before the command and the address are received, the logic circuit is configured to perform a PIM command execution operation. When an error associated with the PIM command execution operation occurs, the logic circuit is configured to generate error data and record the error data at the log register through the first channels. In a first operation mode, the logic circuit is configured to output event data indicating an existence of the error data to the host through second channels in response to a second command and a second address. In a second operation mode, the logic circuit is configured to output the event data to the host through third channels in response to generating the error data.

BRIEF DESCRIPTION OF THE FIGURES

The above and other objects and features of the present disclosure will become apparent by describing in detail embodiments thereof with reference to the accompanying drawings.

FIG. 9 is a table illustrating a severity signal output through severity pins.

DETAILED DESCRIPTION

Below, some embodiments of the present disclosure will be described in detail and to such an extent that a person of ordinary skill in the art may implement the inventive concepts disclosed herein.

Figure 1:
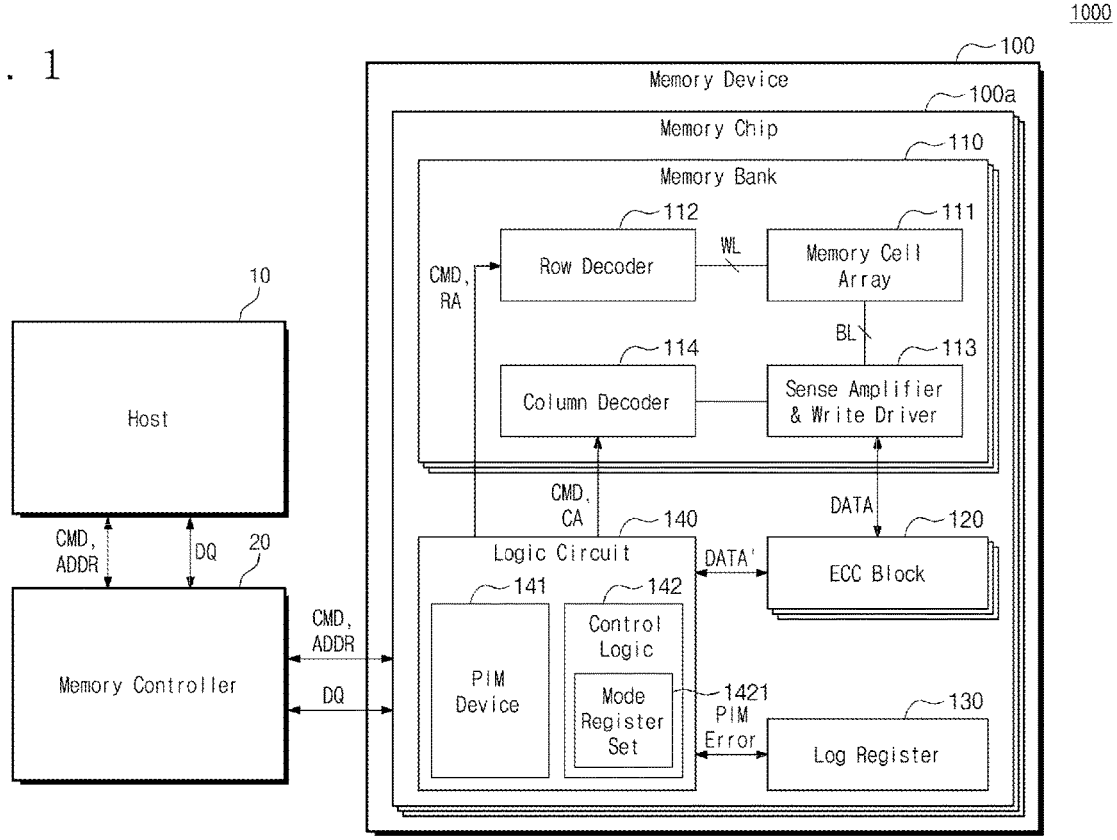
FIG. 1 is a block diagram illustrating an electronic device according to some embodiments of the present disclosure.

FIG. 1 is a block diagram illustrating an electronic device 1000 according to some embodiments of the present disclosure. Referring to FIG. 1, the electronic device 1000 may include a host 10, a memory controller 20, and a memory device 100.

The host 10 may send a command CMD and an address ADDR to the memory device 100 through the memory controller 20. In some embodiments, the host 10 may include the memory controller 20 that sends the command CMD and the address ADDR to the memory device 100. The host 10 may exchange a data signal DQ with the memory controller 20. In the specification, below, the description will be given as the host 10 and memory controller 20 are distinct, and the host 10 sends the command CMD and the address ADDR to the memory device 100 through the memory controller 20.

As an example, the host 10 may send a write command CMD, an address ADDR, and the data signal DQ. The memory controller 20 may send the write command CMD and the address ADDR to the memory device 100. The memory controller 20 may send the data signal DQ to the memory device 100 for the purpose of writing the data in the memory device 100. The memory device 100 may record data at memory cells corresponding to the write command CMD and the address ADDR received from the memory controller 20.

As an example, the host 10 may send a read command CMD and the address ADDR to the memory controller 20. The memory controller 20 may send the read command CMD and the address ADDR to the memory device 100. The memory device 100 may send data, which are read from memory cells corresponding to the read command CMD and the address ADDR received from the memory controller 20, to the memory controller 20 as the data signal DQ. The memory controller 20 may send the data signal DQ to the host 10.

As an example, the memory controller 20 may store a PIM instruction set PIMIS in the memory device 100 before sending the read command and the address to the memory device 100. The PIM instruction set PIMIS may include at least one of various setting commands defined by a standard.

In this case, the memory device 100 may read data from memory cells corresponding to a PIM address generated regardless of at least a portion of the address ADDR received from the memory controller 20. The memory device 100 may perform a PIM operation based on the read data. A PIM address and a configuration for performing a PIM operation will be described in greater detail later.

The memory device 100 may be a dynamic random-access memory (DRAM), but the present disclosure is not limited thereto. The memory device 100 may be one of various random-access memories such as s static random-access memory (SRAM), a magnetic RAM (MRAM), a phase-change RAM (PRAM), a ferroelectric RAM (FRAM), and a resistive RAM (RRAM).

The memory device 100 may be a high bandwidth memory HBM, but the present disclosure is not limited thereto. In the specification, below, the description will be given as the memory device 100 is a high bandwidth memory HBM that performs or is configured to perform in-memory processing.

The memory device 100 may include a plurality of memory chips 100a to 100n. For convenience and brevity, description will be given below for one memory chip 100a. The remaining memory chips 100b to 100n that are not explicitly described may include the same components as the memory chip 100a.

The memory chip 100a may include a plurality of memory banks 110, an error correction code block 120, a log register 130, and a logic circuit 140. Each of the plurality of memory banks 110 may include a memory cell array 111, a row decoder 112, a sense amplifier and write driver 113, and a column decoder 114.

The memory cell array 111 may include a plurality of memory cells (not illustrated) arranged in a row direction and a column direction. Each of the plurality of memory cells may be connected with one of a plurality of word lines WL and one of a plurality of bit lines BL.

The row decoder 112 may operate under control of the logic circuit 140. The row decoder 112 may activate a word line WL selected as an access target from among the plurality of word lines WL based on a command and row address (CMD, RA) received from the logic circuit 140.

The sense amplifier and write driver 113 may operate under control of the logic circuit 140. The sense amplifier and write driver 113 may be connected with a plurality of memory cells through the plurality of bit lines BL.

The column decoder 114 may operate under control of the logic circuit 140. The column decoder 114 may be connected with the sense amplifier and write driver 113. The column decoder 114 may select one or more of the plurality of bit lines BL based on a command and column address (CMD, CA) received from the logic circuit 140.

The memory chip 100a may include a plurality of error correction code blocks. The error correction code blocks may be respectively connected with the plurality of memory banks 110. Herein, one error correction code block 120 will be described. The remaining error correction code blocks that are not explicitly described herein may be identical to or similar to the described error correction code block 120.

The error correction code block 120 may perform error correction encoding on data to be transferred to the plurality of memory banks 110 by using an error correction code ECC. The error correction code block 120 may perform error correction decoding on data received from the plurality memory banks 110 by using the error correction code ECC.

The log register 130 may be configured to record information about an error occurring in the memory chip 100a as a PIM error. The log register 130 may record error data "PIM error" through the IEEE 1500 scheme. However, a way to record the error data "PIM error" is not limited thereto.

The logic circuit 140 may store the PIM instruction set PIMIS received from the host 10 through the memory controller 20. The PIM instruction set PIMIS may include at least one of various setting commands defined by a standard.

When the command CMD and the address ADDR is received from the memory controller 20, the logic circuit 140 may determine an operation mode of the memory chip 100a depending on whether the PIM instruction set PIMIS exists.

When the PIM instruction set PIMIS is absent from the logic circuit 140, the memory chip 100a may write data in the plurality of memory banks 110 based on the write command, the address, and the data signal DQ received from the memory controller 20, or the memory chip 100a may read data written in the plurality of memory banks 110 based on the read command and the address received from the memory controller 20.

When the PIM instruction set PIMIS is present in the logic circuit 140, the memory chip 100a may perform the PIM operation. Below, in the specification, the description will be given as though the PIM instruction set PIMIS is present in advance in the logic circuit 140 and the memory chip 100a performs the PIM operation based on the presence of the PIM instruction set PIMIS.

The logic circuit 140 may include a processing in memory (PIM) device 141 and control logic 142. The PIM device 141 may execute a PIM command corresponding to the PIM instruction set PIMIS based on the command CMD and the address ADDR received from the memory controller 20. A configuration for executing the PIM command will be described in greater detail later.

The control logic 142 may receive the command and the address (CMD, ADDR) from the memory controller 20. The control logic 142 may allow the PIM command corresponding to the PIM instruction set PIMIS to be executed based on the command CMD and the address ADDR.

The control logic 142 may include a mode register set 1421. The mode register set 1421 may include information about a mode that is in advance set, received from the memory controller 20.

For example, the mode register set 1421 may include information about the operation mode of the memory chip 100a and information about a report mode for reporting an error generated in the memory chip 100a to the host 10. However, the information included in the mode register set 1421 is not limited thereto.

The operation mode of the memory chip 100a may be as described above, and thus, additional description will be omitted to avoid redundancy. A configuration for an error report mode in which the memory chip 100a reports an error to the host 10 will be described in greater detail herein.

When the read command and the address is received from the memory controller 20, the PIM device 141 may read data "DATA" from the selected memory cells in the selected memory bank. In this case, the error correction code block 120 may receive the data "DATA" of the selected memory cells. A configuration for reading the data "DATA" of the selected memory cells based on the read command and the address will be described in greater detail below.

The error correction code block 120 may perform error correction decoding on the data "DATA" of the selected memory cells by using the error correction code ECC. When the error correction succeeds, the PIM device 141 may receive error-corrected data DATA' from the error correction code block 120.

The error correction code block 120 may determine that the error correction for the data "DATA" is not possible or impossible, and may indicate the same as the error correction decoding result. In this case, the error correction code block 120 may generate an error correction fail code UECC. The error correction code block 120 may provide the error correction fail code UECC to the logic circuit 140.

The log register 130 may be connected with the logic circuit 140 through first channels. The log register 130 may receive the error correction fail code UECC from the logic circuit 140 through the first channels. The log register 130 may record the error correction fail code UECC as the error data "PIM error" in the IEEE 1500 scheme. However, a way to record the error correction fail code UECC at the log register 130 is not limited thereto.

In addition, the log register 130 may be configured to record the error data "PIM error" including information about an error occurring while the PIM command is executed in the PIM device 141 or information about an error that occurs in the PIM device 141 with regard to an address received from the memory controller 20. The error data "PIM error" will be described in greater detail herein.

The log register 130 may output the error data "PIM error", which are recorded based on the command and the address (hereinafter referred to as an "error read command and an address") received from the memory controller 20 to read the error data, to the logic circuit 140 according to a scheme, e.g., in the IEEE 1500 scheme. The logic circuit 140 may output the error data "PIM error" to the memory controller 20 through a pin different from a DQ pin. However, a way for the log register 130 to output the error data to the logic circuit 140 is not limited thereto.

Figure 2:
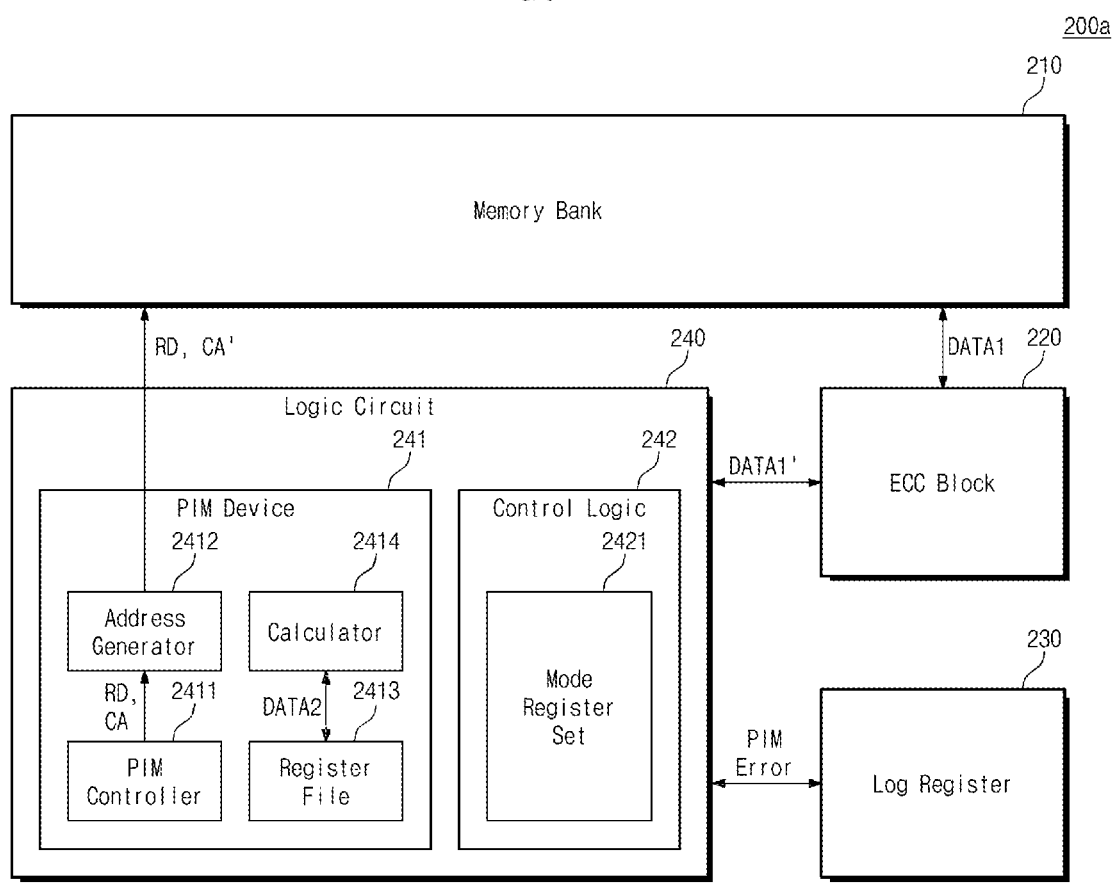
FIG. 2 is a diagram illustrating a configuration of a logic circuit recording error data in a memory chip.

FIG. 2 is a diagram illustrating a configuration of a logic circuit 240 recording the error data "PIM error" in a memory chip 200a. In some embodiments, a memory bank 210, an error correction code block 220, a log register 230, and the logic circuit 240 included in the memory chip 200a of FIG. 2 respectively correspond to one of the memory banks 110, the error correction code block 120, the log register 130, and the logic circuit 140 included in the memory chip 100a of FIG. 1. Thus, additional description associated with similar components and similar operations will be omitted herein in the interest of brevity.

In FIG. 2, the description will be given as the logic circuit 240 receives the command CMD and the address ADDR from the memory controller 20 of FIG. 1. In FIG. 2, the PIM command execution operation of a PIM device 241 will be described based on the column address CA of the address ADDR.

The command CMD may be at least one of a read command RD, a write command WR, an active command ACT, and a precharge command PRE. In FIG. 2, the description will be given based on the read command RD among the commands CMD that the logic circuit 240 receives.

As an example, the column address CA may be an incorrect address. The incorrect address may refer to an address that is not capable or incapable of accessing any memory bank among a plurality of memory banks. The logic circuit 240 may determine whether an error is present in the column address CA. A configuration for reporting and recording an address error ADER when an error is present in the column address CA will be described in greater detail later.

Referring to FIGS. 1 and 2, the PIM device 241 may include a PIM controller 2411, an address generator 2412, a register file 2413, and a calculator 2414. Although not illustrated, the PIM instruction set PIMIS may be present in the register file 2413 before receiving a read command and column address (RD, CA) from the memory controller 20.

The PIM instruction set PIMIS may include information about an operator and a plurality of registers in the register file 2413. However, the information included in the PIM instruction set PIMIS is not limited thereto.

The PIM controller 2411 may execute the PIM command based on the PIM instruction set PIMIS stored in advance. The PIM command may include the read command RD; however, the PIM command may include a command that directs to perform the PIM operation in addition to an operation indicated by the read command RD and to store a result DATA2 of the PIM operation in the register file 2413.

The column address CA that the PIM controller 2411 receives from the memory controller 20 may be an incorrect address. In this case, the logic circuit 240 may determine that it is not possible or impossible to access the selected memory cells of the memory bank 210 corresponding to the received column address CA and may generate an address error ADER.

As an example, the logic circuit 240 may generate event data indicating that an error is present in an address. In this case, the logic circuit 240 may store the event data until the command and the address are received from the memory controller 20.

As an example, the logic circuit 240 may record the error data "PIM error" including the address error ADER at the log register 230 together with the event data according to the IEEE 1500 scheme. However, a way to record the event data and the address error ADER at the log register 230 is not limited thereto.

When the command and the address are received from the memory controller 20, the logic circuit 240 may output the recorded event data to the memory controller 20.

As an example, the logic circuit 240 may record the error data "PIM error" including the address error ADER at the log register 230 according to the IEEE 1500 scheme. However, a way to record the address error ADER at the log register 230 is not limited thereto.

For example, in response to that the command and the address are received from the memory controller 20, the logic circuit 240 may determine that the error data "PIM error" exist; in this case, the logic circuit 240 may output the event data corresponding to the error data "PIM error" to the memory controller 20.

The address generator 2412 may operate under control of control logic 242. The address generator 2412 may receive the read command and column address (RD, CA) from the PIM controller 2411. In this case, the address generator 2412 may provide the memory bank 210 with a PIM address CA' generated regardless of at least a portion of the column address CA.

Although not illustrated, the column address CA may include a plurality of column address bits. For example, the PIM address CA' may be an address generated based on the remaining column address bits other than some column address bits among the column address bits. However, the PIM address CA' that the address generator 2412 generates is not limited thereto.

The register file 2413 may include a plurality of registers. The plurality of registers may be configured to store the data DATA2 before the PIM operation and after the PIM operation.

The register file 2413 may operate under control of the control logic 242. The control logic 242 may control the register file 2413 such that the data DATA2 of a register corresponding to the PIM address CA' from among registers included in the PIM instruction set are used in the PIM operation.

The calculator 2414 may operate under control in the control logic 242. The calculator 2414 may receive the data DATA2 of the register corresponding to the PIM address CA' and the data DATA1' of the selected memory cells corresponding to the PIM address CA' from among the memory cells of the memory bank 210.

The calculator 2414 may perform the PIM operation based on the data DATA2 of the register corresponding to the PIM address CA' and the data DATA1' of the selected memory cells corresponding to the PIM address CA'. The control logic 242 may allow the calculator 2414 to perform the PIM operation. The control logic 242 may allow the calculator 2414 to store the result DATA2 of the PIM operation in the register file 2413.

The control logic 242 may control an overall operation of the PIM device 241. In greater detail, the control logic 242 may control an operation in which the PIM device 241 reads data from the memory bank 210 and/or an operation in which the PIM device 241 performs the PIM operation.

A PIM hardware error "H/W error" may exist in the PIM device 241. The PIM hardware error "H/W error" may include an error of the PIM instruction set PIMIS and/or an error of a register included in the register file 2413. However, the PIM hardware error "H/W error" that may occur in the PIM device 241 is not limited thereto.

The error of the PIM instruction set PIMIS may mean or may include a case where there is no PIM instruction set PIMIS corresponding to the command CMD and the address ADDR. For example, the PIM instruction set PIMIS that does not exist may mean a case where the received command CMD does not coincide with the operator included in the PIM instruction set PIMIS.

As an example, the logic circuit 240 may generate the event data indicating that an error is present in the PIM instruction set PIMIS. In this case, the logic circuit 240 may store the event data until the command and the address are received from the memory controller 20.

As an example, the logic circuit 240 may record the error data "PIM error" including the error of the PIM instruction set PIMIS at the log register 230 together with the event data according to the IEEE 1500 scheme. However, a way to record the event data and the error of the PIM instruction set PIMIS at the log register 230 is not limited thereto.

For example, when the command and the address are received from the memory controller 20, the logic circuit 240 may output the recorded event data to the memory controller 20.

As an example, the logic circuit 240 may record the error data "PIM error" including the error of the PIM instruction set PIMIS at the log register 230 according to the IEEE 1500 scheme. However, a way to record the error of the PIM instruction set PIMIS at the log register 230 is not limited thereto.

For example, in response to that the command and the address are received from the memory controller 20, the logic circuit 240 may determine that the error data "PIM error" exist; in this case, the logic circuit 240 may output the event data corresponding to the error data "PIM error" to the memory controller 20.

The logic circuit 240 may read data of the selected memory cells in the memory bank 210, which correspond to the PIM address CA'. In this case, the error correction code block 220 may receive data DATA1 of the selected memory cells.

The error correction code block 220 may perform error correction decoding on the data DATA1 of the selected memory cells by using the error correction code ECC. When the error correction succeeds, the logic circuit 240 may receive the error correction decoded data DATA1'.

The error correction code block 220 may determine that the error correction for the data is not possible or impossible, and may indicate as such as the error correction decoding result. In this case, the error correction code block 120 may generate the error correction fail code UECC. The error correction code block 120 may provide the error correction fail code UECC to the logic circuit 240.

As an example, the logic circuit 240 may generate the event data based on the error correction fail code UECC. The event data may refer to data indicating that an error occurs in the read operation for the data of the selected memory cells. In this case, the logic circuit 240 may store the event data until the command and the address are received from the memory controller 20.

As an example, the logic circuit 240 may record the error data "PIM error" including the error correction fail code UECC at the log register 230 together with the event data according to the IEEE 1500 scheme. However, a way to record the event data and the error correction fail code UECC at the log register 230 is not limited thereto.

For example, when the command and the address are received from the memory controller 20, the logic circuit 240 may output the recorded event data to the memory controller 20.

As an example, the logic circuit 240 may record the error data "PIM error" including the error correction fail code UECC at the log register 230 together with the event data according to the IEEE 1500 scheme. However, a way to record the error correction fail code UECC at the log register 230 is not limited thereto.

For example, in response to that the command and the address are received from the memory controller 20, the logic circuit 240 may determine that the error data "PIM error" exist; in this case, the logic circuit 240 may output the event data corresponding to the error data "PIM error" to the memory controller 20.

The calculator 2414 may read the data DATA2 of the register in the register file 2413, which correspond to the PIM address CA'. When the register corresponding to the PIM address CA' does not exist, a register error may occur in the PIM device 241.

As an example, the logic circuit 240 may generate the event data indicating that an error is present in a register. In this case, the logic circuit 240 may store the event data until the command and the address are received from the memory controller 20.

As an example, the logic circuit 240 may record the error data "PIM error" including the register error at the log register 230 together with the event data according to the IEEE 1500 scheme. However, a way to record the event data and the register error at the log register 230 is not limited thereto.

For example, when the command and address is received from the memory controller 20, the logic circuit 240 may output the recorded event data to the memory controller 20.

As an example, the logic circuit 240 may record the error data "PIM error" including the register error at the log register 230 according to the IEEE 1500 scheme. However, a way to record the register error at the log register 230 is not limited thereto.

For example, in response to that the command and the address are received from the memory controller 20, the logic circuit 240 may determine that the error data "PIM error" exist; in this case, the logic circuit 240 may output the event data corresponding to the error data "PIM error" to the memory controller 20.

The control logic 242 may include a mode register set 2421. The mode register set 2421 may include information about an error report mode that is in advance set, received from the memory controller 20, such that an error is reported to the host 10.

The error report mode may mean a mode in which the event data are output from the memory chip 200a to the host 10 through the memory controller 20. Accordingly, the memory chip 200a may output the event data to the host 10 in various schemes, depending on a mode set in advance received from the memory controller 20. A configuration for outputting the event data to the host 10 to report an error and a configuration for outputting the error data "PIM error" will be described in greater detail later.

Figure 3:
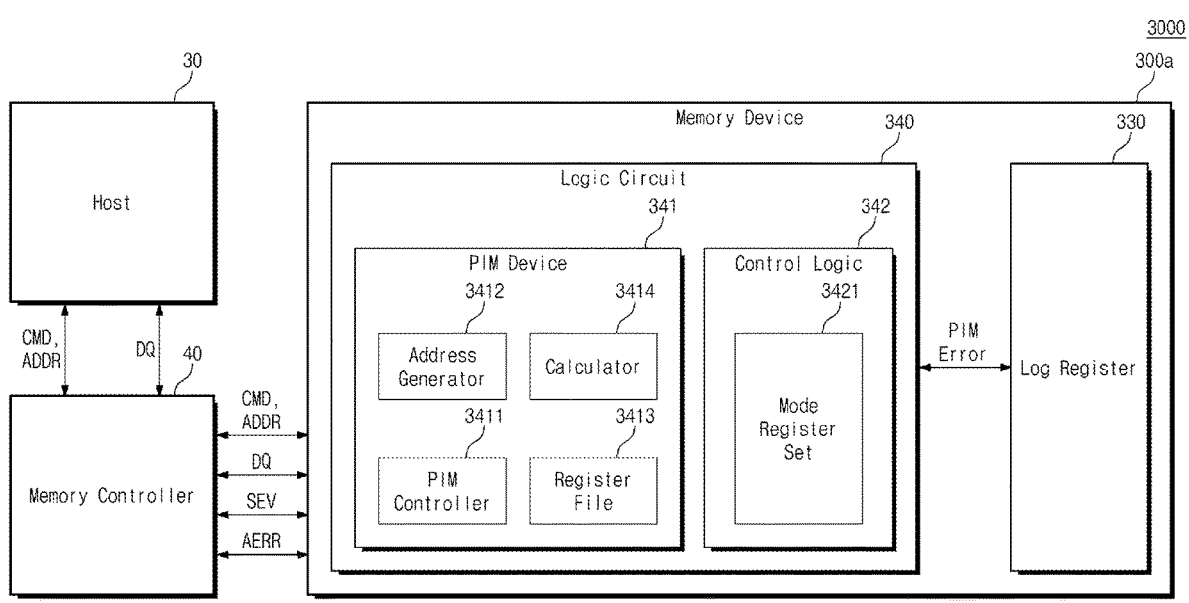
FIG. 3 is a diagram illustrating a configuration of an electronic device in which a memory chip outputs event data to a host.

FIG. 3 is a diagram illustrating a configuration of an electronic device 3000 in which a memory chip 300a outputs event data to a host 30, in detail. In some embodiments, a log register 330 and a logic circuit 340 included in the memory chip 300a of FIG. 3 respectively correspond to the log register 230 and the logic circuit 240 included in the memory chip 200a of FIG. 2.

A PIM controller 3411, an address generator 3412, a register file 3413, and a calculator 3414 included in a PIM device 341 of FIG. 3 respectively correspond to the PIM controller 2411, the address generator 2412, the register file 2413, and the calculator 2414 included in the PIM device 241 of FIG. 2. Thus, additional description associated with similar components and similar operations will be omitted here in the interest of brevity.

Referring to FIGS. 1 to 3, the memory controller 20/40 may record information about the error report mode at the mode register set 1421/2421/3421 included in the control logic 142/242/342. The memory controller 20/40 may in advance set the mode register set 1421/2421/3421 with information about the error report mode before sending the command CMD and the address ADDR to the memory chip 300a.

As an example, the memory controller 20/40 may set the mode register set 1421/2421/3421 with a first operation mode.

In the first operation mode, the memory chip 100a/200a/300a may read data of selected memory cells of the memory bank 210 corresponding to the read command and the address (RD, ADDR) received from the memory controller 20/40. When the read data of the selected memory cells are output to the memory controller 20/40 as the data signal DQ, the event data corresponding to the error data "PIM error" may be output to the memory controller 20/40 through second channels.

The second channels may include a plurality of channels that connect the memory controller 20/40 and the memory chip 100a/200a/300a. First ends of the second channels may be respectively electrically connected with severity (SEV) pins of the memory chip 100a/200a/300a, and second ends of the second channels may be electrically connected with the memory controller 20/40.

As described above, the error data "PIM error" may include information about at least one of the PIM hardware error "H/W error", the address error ADER, or the error correction fail code UECC. The above description given with reference to the error data "PIM error" will be omitted here in the interest of brevity.

The memory controller 20/40 may send the data signal DQ and the event data received from the memory chip 100a/200a/300a to the host 10/30. The host 10/30 may determine that the error is present in the memory chip 100a/200a/300a based on the event data, and may send an error read command and the address to the memory chip 100a/200a/300a through the memory controller 20/40.

The memory chip 100a/200a/300a may read the error data "PIM error" recorded at the log register 130/230/330 according to the IEEE 1500 scheme, based on the error read command and the address. However, a way for the memory chip 100a/200a/300a to read the error data "PIM error" is not limited thereto. The memory chip 100a/200a/300a may send the read error data "PIM error" to the memory controller 20/40.

The memory controller 20/40 may send the error data "PIM error" to the host 10/30. The host 10/30 may normalize the memory chip 100a/200a/300a based on the error data "PIM error".

As an example, the memory controller 20/40 may set the mode register set 1421/2421/3421 with a second operation mode.

In the second operation mode, the memory chip 100a/200a/300a may output the event data corresponding to the error data "PIM error" to the memory controller 20/40 through third channels in response to the command CMD and the address ADDR received from the memory controller 20/40.

The third channels may include a plurality of channels that connect the memory controller 20/40 and the memory chip 100a/200a/300a. First ends of the third channels may be electrically connected with an address error (AERR) pin of the memory chip 100a/200a/300a, and second ends of the third channels may be electrically connected with the memory controller 20/40.

The memory controller 20/40 may send the event data received from the memory chip 100a/200a/300a to the host 10/30. The host 10/30 may determine that the error is present in the memory chip 100a/200a/300a based on the event data, and may send the error read command and the address to the memory chip 100a/200a/300a through the memory controller 20/40.

The memory chip 100a/200a/300a may read the error data "PIM error" recorded at the log register 130/230/330 according to the IEEE 1500 scheme, based on the error read command and the address. However, a way for the memory chip 100a/200a/300a to read the error data "PIM error" is not limited thereto. The memory chip 100a/200a/300a may send the read error data "PIM error" to the memory controller 20/40.

The memory controller 20/40 may send the error data "PIM error" to the host 10/30. The host 10/30 may normalize the memory chip 100a/200a/300a based on the error data "PIM error".

However, the present disclosure is not limited thereto. For example, the event data may be output to the memory controller 20/40 through channels different from the second channels and the third channels. A configuration of the event data output through the second channels and the third channels will be described in greater detail herein.

When the control logic 142/242/342 controls the operation of the memory chip 100a/200a/300a based on the second operation mode, the host 10/30 may receive (e.g., may receive relatively quickly) a report on the error occurring in the memory chip 100a/200a/300a through the third channels and the memory controller 20/40. Accordingly, the host 10/30 may normalize (e.g., may normalize relatively quickly) the memory chip 100a/200a/300a based on the event data and the error data "PIM error" received from the memory chip 100a/200a/300a.

Figure 4:
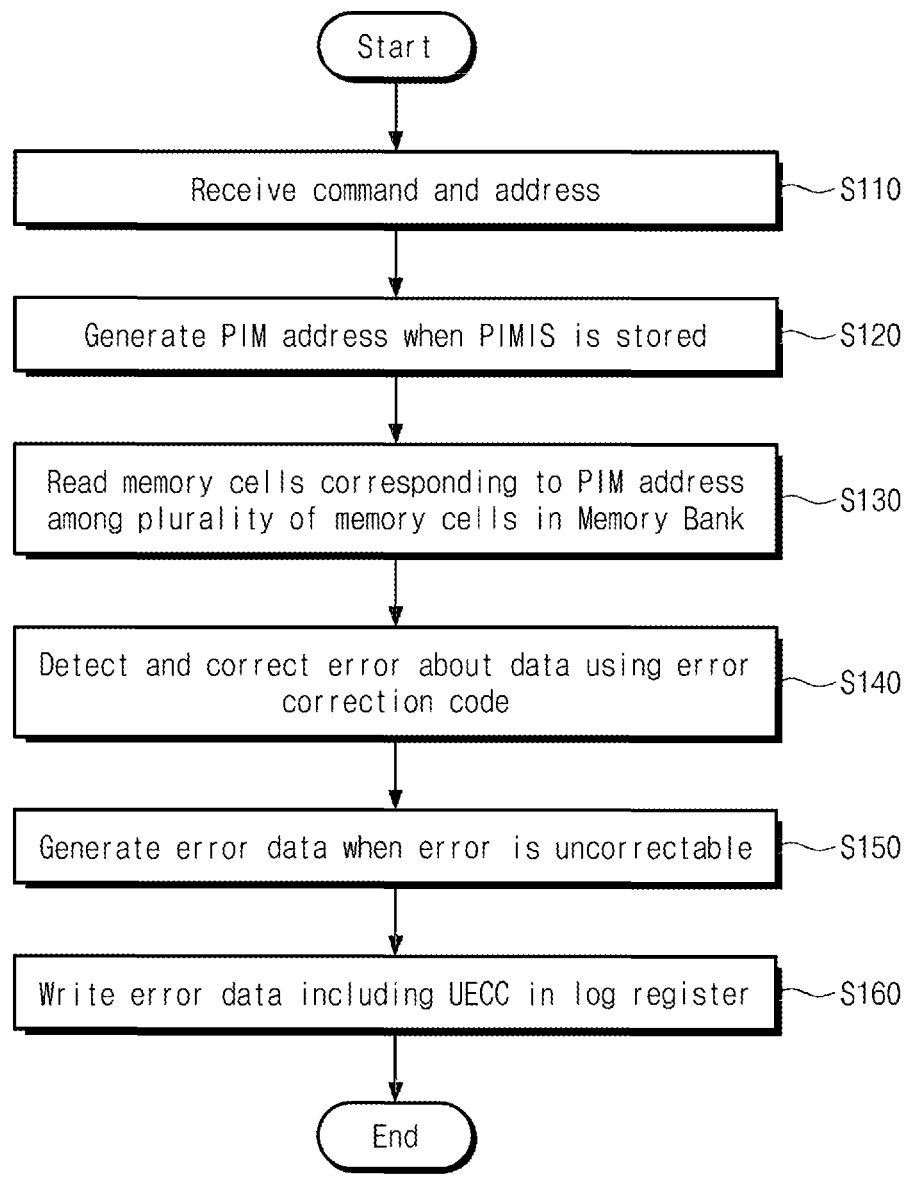
FIG. 4 is a flowchart illustrating an embodiment of an operating method in which a memory chip records error data.

FIG. 4 is a flowchart illustrating an embodiment of an operating method in which a memory chip records error data.

Referring to FIGS. 1, 2, and 4, in operation S110, the memory chip 100a/200a may receive the command and the address from the memory controller 20. In this case, the command may be the read command for the PIM operation.

When the PIM instruction set PIMIS is present in the memory chip 100a/200a before receiving the command and the address from the memory controller 20, in operation S120, the memory chip 100a/200a may generate the PIM address regardless of at least a portion of the received address. The above description given with reference to the PIM address will be omitted here.

In operation S130, the memory chip 100a/200a may perform the read operation on data recorded at selected memory cells in a selected memory bank, which may correspond to the PIM address.

In operation S140, the memory chip 100a/200a may receive the data read from the selected memory cells and may perform error correction decoding on the received data. The memory chip 100a/200a may detect and correct an error in the read operation by using the error correction code ECC.

In operation S150, the memory chip 100a/200a may generate the error data based on failure of the error correction. The error data may include the error correction fail code UECC.

In operation S160, the memory chip 100a/200a may record the error data including the error correction fail code UECC at the log register 130/230.

Figure 5:
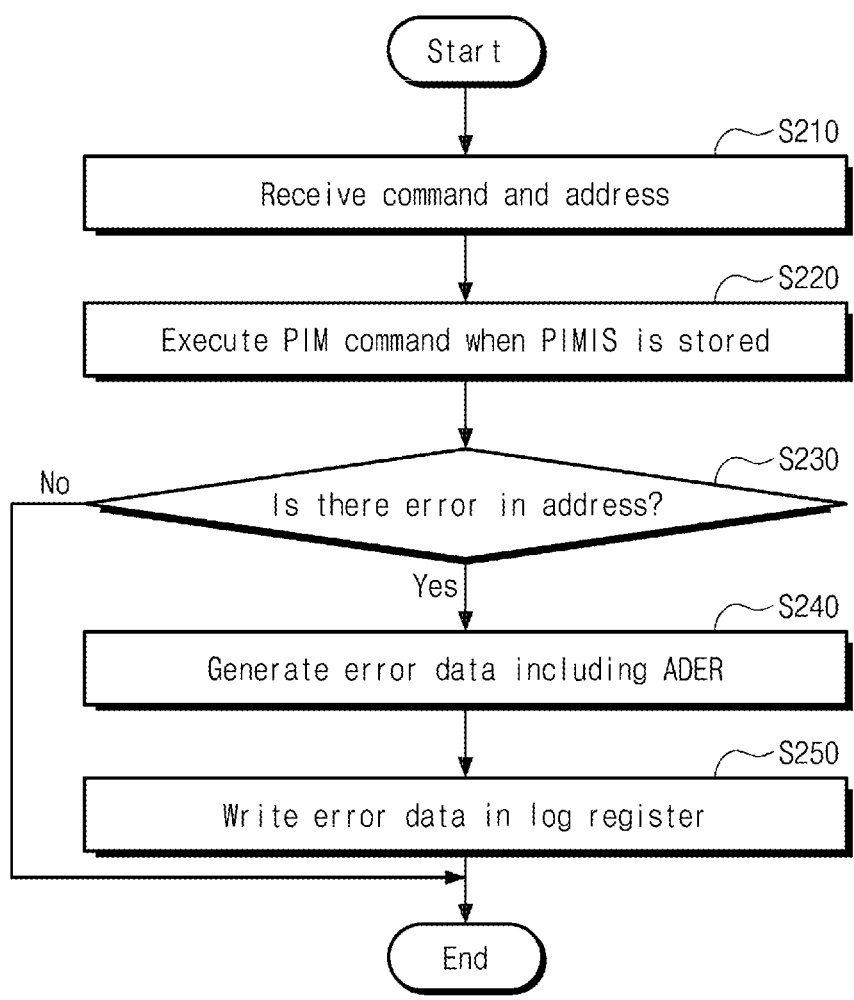
FIG. 5 is a flowchart illustrating an embodiment of an operating method in which a memory chip records error data.

FIG. 5 is a flowchart illustrating an embodiment of an operating method in which a memory chip records error data.

Referring to FIGS. 1, 2, and 5, in operation S210, the memory chip 100a/200a may receive the command and the address from the memory controller 20. In this case, the command may be the read command for the PIM operation.

When the PIM instruction set is present in the memory chip 100a/200a before the command and the address is received from the memory controller 20, in operation S220, the memory chip 100a/200a may execute the PIM command. The above description given with reference to the PIM command will be omitted here.

In operation S230, the memory chip 100a/200a may determine whether an error is present in the address received from the memory controller 20. When the error is present in the address ("Yes" from operation S230), operation S240 and operation S250 may be performed. When the error is absent from the address ("No" from operation S230), the procedure ends.

In operation S240, the memory chip 100a/200a may generate the error data based on the address error ADER. The error data may include the address error ADER.

In operation S250, the memory chip 100a/200a may record the error data including the address error ADER at the log register 130/230.

Figure 6:
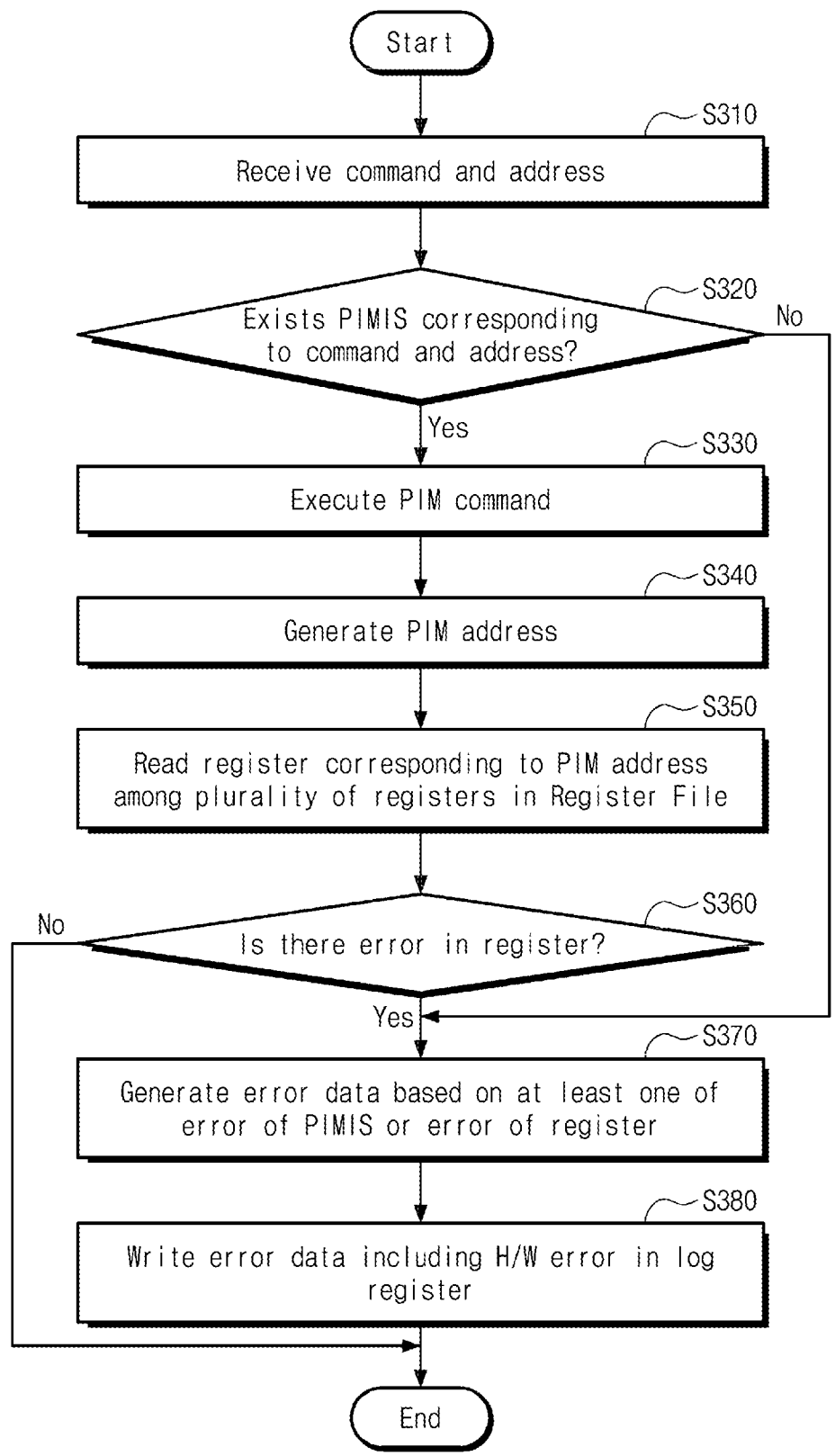
FIG. 6 is a flowchart illustrating an embodiment of an operating method in which a memory chip records error data.

FIG. 6 is a flowchart illustrating an embodiment of an operating method in which a memory chip records error data.

Referring device FIGS. 1, 2, and 6, in operation S310, the memory chip 100a/200a may receive the command and the address from the memory controller 20. In this case, the command may be the read command for the PIM operation.

In operation S320, the memory chip 100a/200a may determine whether there is the PIM instruction set PIMIS corresponding to the command and the address. When there is the PIM instruction set PIMIS corresponding to the command and the address ("Yes" from operation S320), operation S330 to operation S350 may be performed. When there is no PIM instruction set PIMIS corresponding to the command and the address ("No" from operation S320), that is, when an error is present in the PIM instruction set PIMIS stored in the memory chip 100a/200a, operation S370 to operation S380 may be performed.

In operation S330, the memory chip 100a/200a may execute the PIM command based on the stored PIM instruction set PIMIS. The above description given with reference to the PIM command will be omitted here.

In operation S340, the memory chip 100a/200a may generate the PIM address regardless of at least a portion of the address received from the memory controller 20. The above description given with reference to the PIM address will be omitted here.

In operation S350, the memory chip 100a/200a may perform the read operation on data of a register in the register file 2413, which corresponds to the PIM address.

In operation S360, the memory chip 100a/200a may determine whether an error is present in the register of the register file 2413. The above description given with reference to the register error will be omitted here. When there is the register error ("Yes" from operation S360), operation S370 and operation S380 may be performed. When the error is absent from the register ("No" from operation S360), the procedure ends.

In operation S370, the memory chip 100a/200a may generate the error data based on at least one (e.g., the PIM hardware error "H/W error") of the error of the PIM instruction set PIMIS or the error of the register.

In operation S380, the memory chip 100a/200a may record the error data including the PIM hardware error "H/W error" at the log register 130/230.

Figure 7:
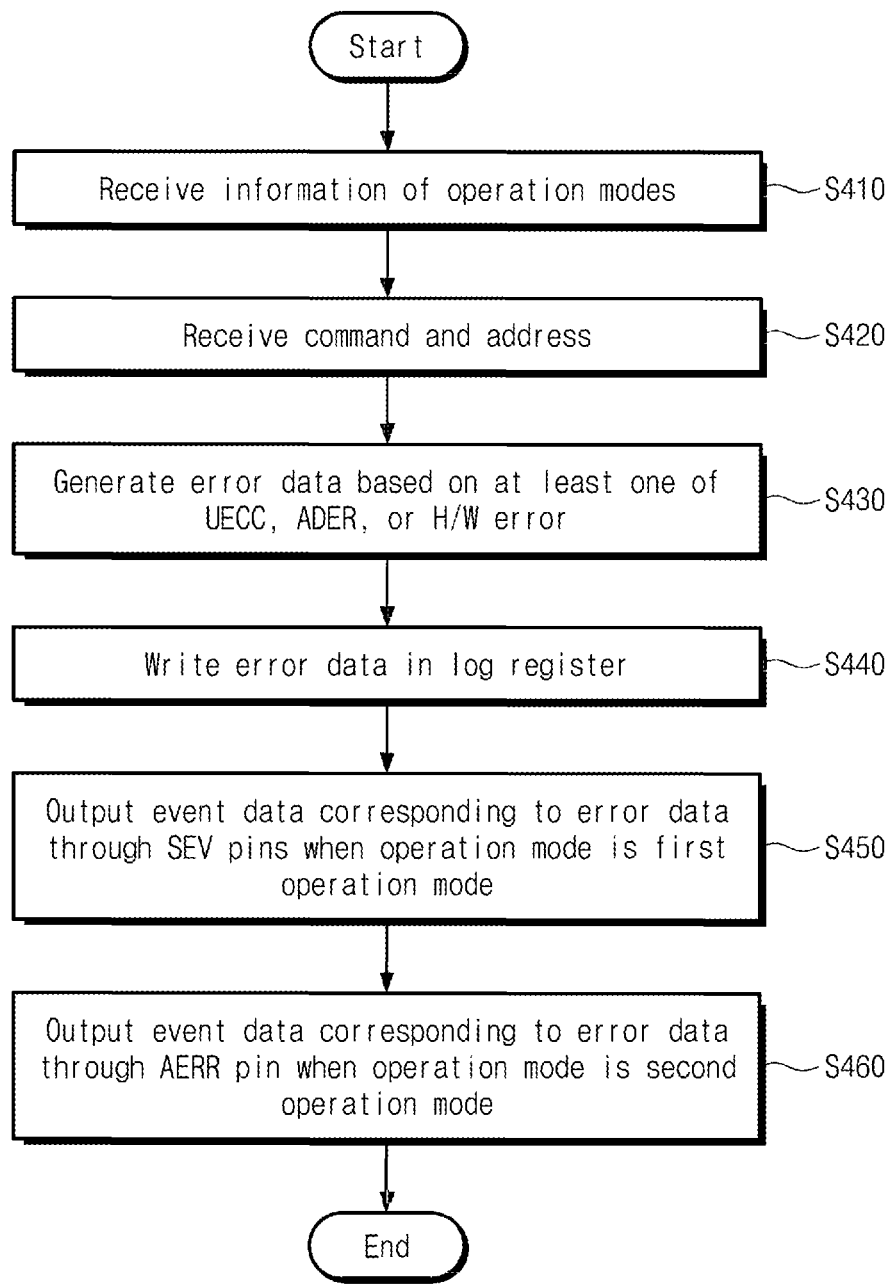
FIG. 7 is a flowchart illustrating an operating method in which a mode of outputting event data differs depending on an operation mode of a memory chip.

FIG. 7 is a flowchart illustrating an operating method in which a mode of outputting event data differs depending on an operation mode of a memory chip.

Referring device FIGS. 1, 3, and 7, in operation S410, the memory chip 100a/300a may receive information about the operation mode from the memory controller 20/40. The operation mode of the memory chip 100a/300a may include information about the error report mode in which an error is reported to the host 10/30. The above description given with reference to the operation mode of the memory chip 100a/300a will be omitted here.

In operation S420, the memory chip 100a/300a may receive the command and the address from the memory controller 20/40. In this case, the command may be the read command for the PIM operation.

In operation S430, the memory chip 100a/300a may generate the error data based on at least one of the PIM hardware error "H/W error", the address error ADER, or the error correction fail code UECC.

In operation S440, the memory chip 100a/300a may record the error data at the log register 130/330.

When the operation mode received from the memory controller 20/40 is the first operation mode, in operation S450, the memory chip 100a/300a may output the event data to the memory controller 20/40 through the SEV pins.

When the operation mode received from the memory controller 20/40 is the second operation mode, in operation S460, the memory chip 100a/300a may output the event data to the memory controller 20/40 through the AERR pin.

Figure 8:
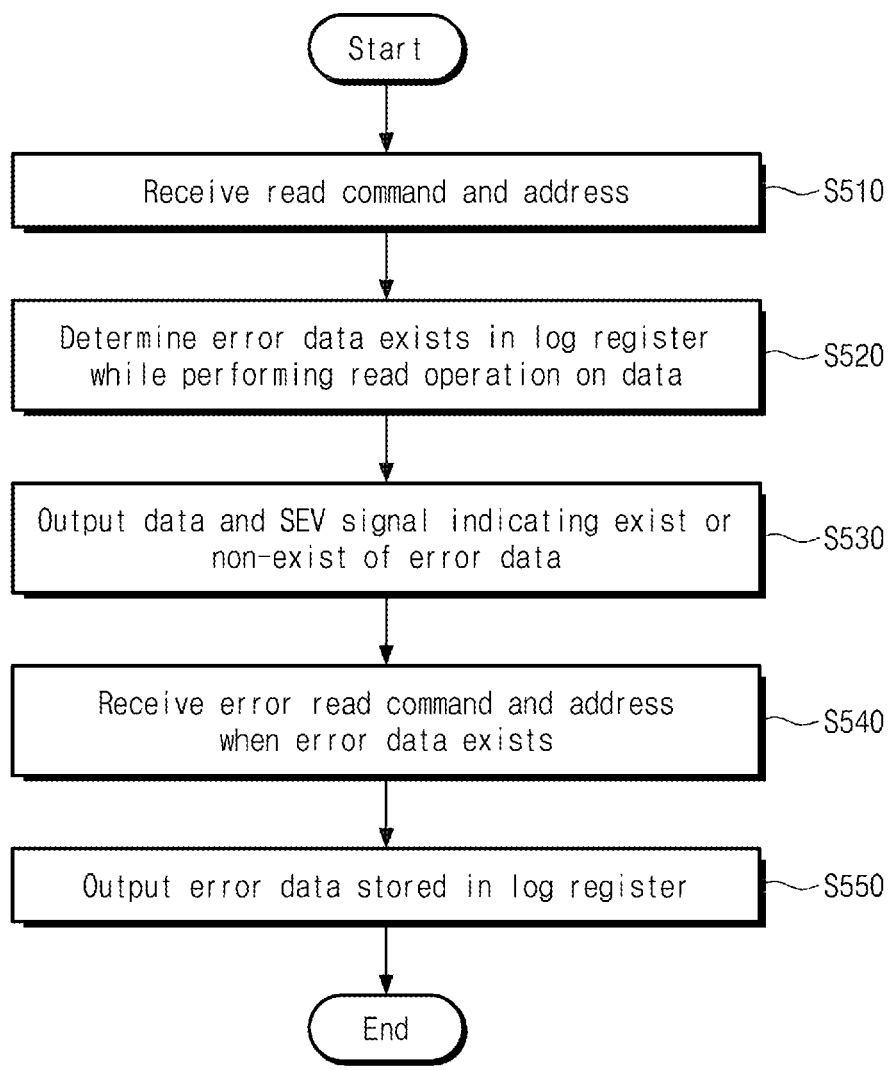
FIG. 8 is a flowchart illustrating an operating method in which a memory chip outputs a severity signal to a host in a second operation mode.

FIG. 8 is a flowchart illustrating an operating method in which a memory chip outputs an SEV signal to a host in a first operation mode, in greater detail.

Referring device FIGS. 1, 3, and 8, in operation S510, the memory chip 100a/300a may receive the read command and the address from the memory controller 20/40.

In operation S520, the memory chip 100a/300a may determine whether error data are present in the log register 130/330, while performing the read operation on data stored in selected memory cells of a memory bank, which correspond to the read command and the address.

In operation S530, the memory chip 100a/300a may output the data and the SEV signal, which indicates that the error data exist, to the host 10/30 through the SEV pins. The SEV signal will be described in greater detail herein.

When the error data exists, in operation S540, the memory chip 100a/300a may receive the error read command and the address from the host 10/30.

In operation S550, the memory chip 100a/300a may output the error data to the host 10/30.

FIG. 9 is a table illustrating an SEV signal output through SEV pins in greater detail. In some embodiments, in FIG. 9, "Error Type" indicates types of errors capable of occurring in a memory device.

A pin may be included in each of a memory device and a memory controller. The pin included in each of the memory device and the memory controller may include a plurality of SEV pins connected with the second channels that include the first ends and the second ends connected with the memory device and the memory controller.

A burst position may mean a position of data that are simultaneously output to the memory controller when the memory device performs the read operation on data of selected memory cells of a memory bank based on the command and the address. FIG. 9 shows the burst positions from 0 to 7, that is, an example in which 8-bit data are simultaneously output, but the present disclosure is not limited thereto.

Herein, SEV[0] may mean a first SEV pin among the plurality of SEV pins. SEV[1] may mean a second SEV pin among the plurality of SEV pins.

Referring to FIGS. 1, 3, and 9, a non-error NE may mean that an error does not occur in the memory chip 100a/300a. A correctable error CE may mean that an error occurring in the memory chip 100a/300a is correctable.

A correctable multi-bit error CEm may mean that a multi-bit error occurring in the memory chip 100a/300a is correctable. An uncorrectable error UE may mean that an error occurring in the memory chip 100a/300a is uncorrectable.

Each of the non-error NE, the correctable error CE, the correctable multi-bit error CEm, and the uncorrectable error UE may be 16-bit event data output through the first SEV pin, the second SEV pin, and the second channels while 8-bit data of memory cells from burst 0 to burst 7 are output from the memory chip 100a/300a to the memory controller 20/40.

The non-error NE may mean event data that are output through the first SEV pin and have a value of "00000000" and event data that are output through the second SEV pin and have a value of "00000000".

The correctable error CE may mean event data that are output through the first SEV pin and have a value of "00001111" and event data that are output through the second SEV pin and have a value of "00000000".

The correctable multi-bit error CEm may mean event data that are output through the first SEV pin and have a value of "00001111" and event data that are output through the second SEV pin and have a value of "00001111".

The uncorrectable error UE may mean event data that are output through the first SEV pin and have a value of "00000000" and event data that are output through the second SEV pin and have a value of "00001111".

A PIM load error correction fail code "PIM Load UECC" may be associated with an error occurring while reading data of memory cells corresponding to the PIM address in the memory chip 100a/300a and may correspond to the error correction fail code UECC of FIG. 4. The address error ADER may correspond to the address error ADER of FIG. 5, and the PIM hardware error "H/W error" may correspond to the PIM hardware error "H/W error" of FIG. 6. Thus, additional description associated with similar components will be omitted here.

Each of the PIM load error correction fail code "PIM Load UECC", the address error ADER, and the PIM hardware error "H/W error" may be 16-bit event data output through the first SEV pin, the second SEV pin, and the second channels while 8-bit data of memory cells from burst 0 to burst 7 are output from the memory chip 100a/300a to the memory controller 20/40.

The PIM load error correction fail code "PIM Load UECC" may mean event data that are output through the first SEV pin and have a value of "11110000" and event data that are output through the second SEV pin and have a value of "11111111".

The address error ADER may mean event data that are output through the first SEV pin and have a value of "11111111" and event data that are output through the second SEV pin and have a value of "11110000".

The PIM hardware error "H/W error" may mean event data that are output through the first SEV pin and have a value of "11111111" and event data that are output through the second SEV pin and have a value of "11111111".

FIG. 9 shows types of errors capable of occurring in the memory chip 100a/300a. In addition to the above error types, various types of errors may occur when the PIM operation is performed in the memory chip 100a/300a; various types of errors may be output and reported to the host 10/30 together with the event data while the data are output from the memory chip 100a/300a to the host 10/30.

Figure 10:
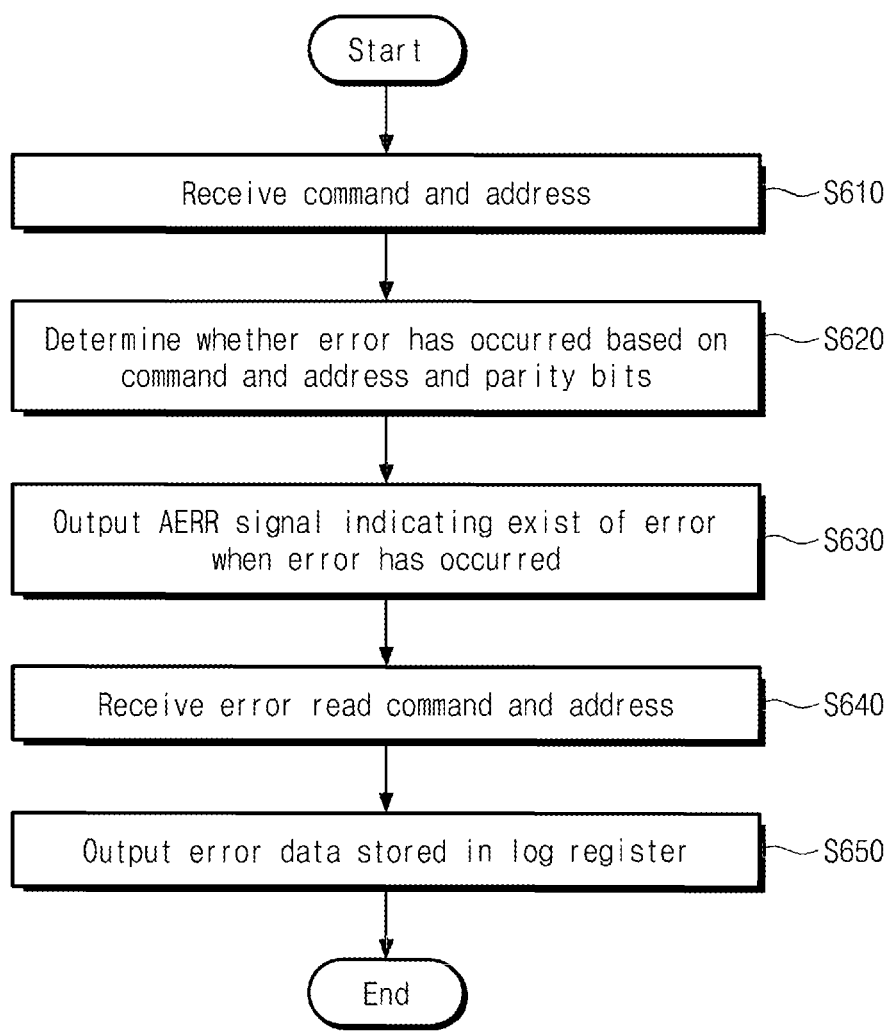
FIG. 10 is a flowchart illustrating an operating method in which a memory chip outputs an address error signal to a host in a second operation mode.

FIG. 10 is a flowchart illustrating an operating method in which a memory chip outputs an address error (AERR) signal to a host in a second operation mode, in greater detail.

Referring device FIGS. 1, 3, and 10, in operation S610, the memory chip 100a/300a may receive the command and the address from the memory controller 20/40.

In operation S620, the memory chip 100a/300a may perform a parity check based on the received command and the address and parity bits and may determine whether an error occurs in the memory chip 100a/300a.

When it is determined that the error occurs, in operation S630, the memory chip 100a/300a may output the AERR signal, which indicates that the error occurs, to the host 10/30 through the AERR pins. The AERR signal will be described in greater detail herein.

In operation S640, the memory chip 100a/300a may receive the error read command and the address from the host 10/30.

In operation S650, the memory chip 100a/300a may output the error data to the host 10/30.

Figure 11:
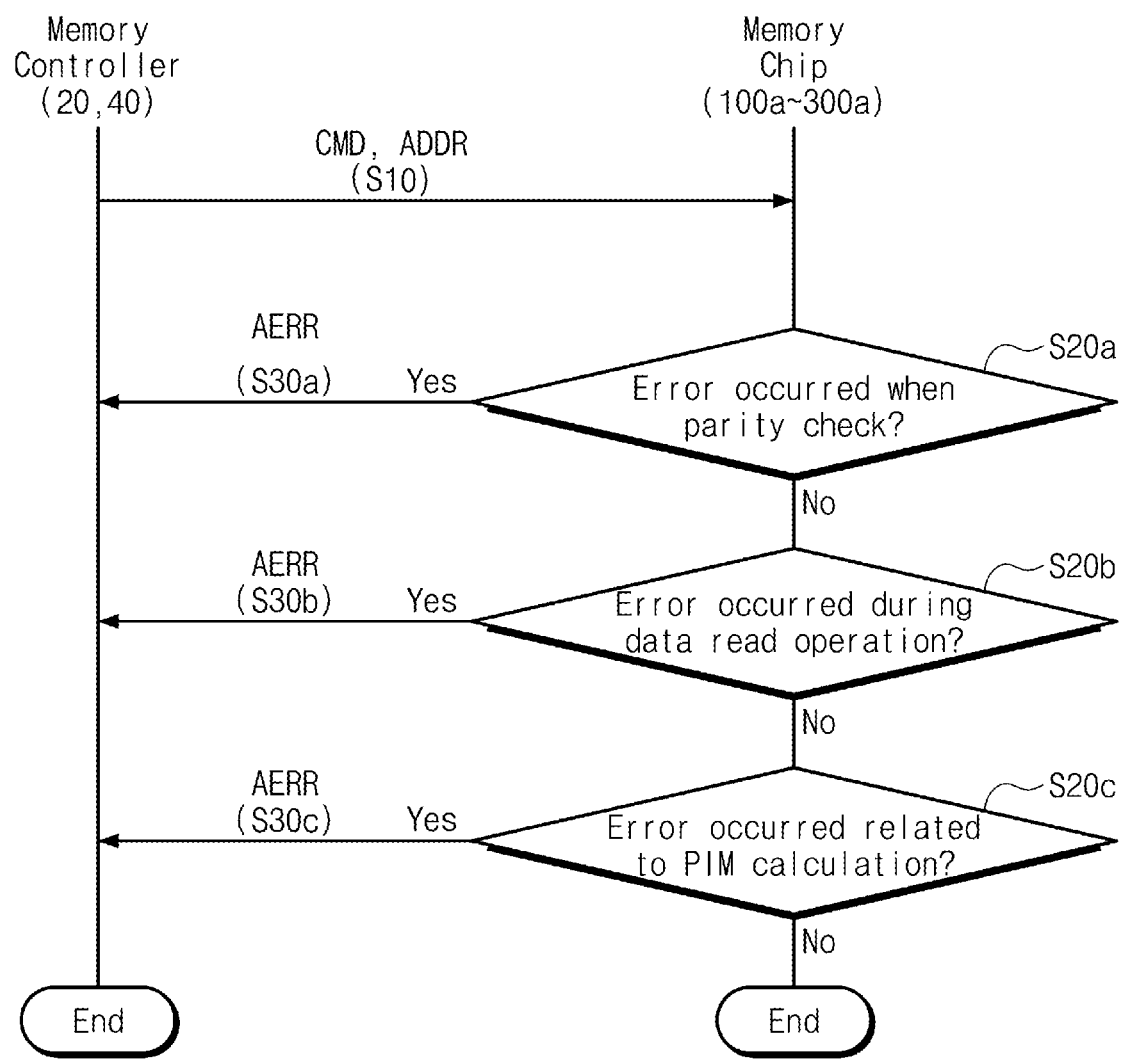
FIG. 11 is a diagram illustrating operation S620 and operation S630 of FIG. 10 in greater detail.

FIG. 11 is a diagram illustrating operation S620 and operation S630 of FIG. 10 in greater detail. In some embodiments, operation S10 of FIG. 11 may correspond to operation S610 of FIG. 10. Operation S20a, operation S20b, and operation S20c of FIG. 11 may correspond to operation S620 of FIG. 10. Operation S30a, operation S30b, and operation S30c of FIG. 11 may correspond to operation S630 of FIG. 10. Thus, additional description will be omitted to avoid redundancy.

Referring to FIGS. 1, 3, and 11, in operation S20a, the memory chip 100a/200a/300a may perform the parity check and may determine whether an error occurs in command and address data (CMD, ADDR).

When it is determined that the error is present in the command and address data (CMD, ADDR) ("Yes" from operation S20a), in operation S30a, the memory chip 100a/200a/300a may output event data corresponding to the error to the memory controller 20/40. The event data may be output to the memory controller 20/40 as the AERR signal. The error of the command and address data (CMD, ADDR) may be an error that it is impossible to access even any of a plurality of memory banks.

When it is determined that the error is absent from the command and address data (CMD, ADDR) ("No" from operation S20a), in operation S20b, the memory chip 100a/200a/300a may determine whether error correction fails during the data read operation associated with the PIM operation.

When it is determined that an error occurs during the read operation ("Yes" from operation S20b), in operation S30b, the memory chip 100a/200a/300a may output event data corresponding to the error to the memory controller 20/40. When the error correction fail code UECC is generated, the memory chip 100a/200a/300a may determine that an error occurs during the read operation.

When it is determined that the error correction succeeds during the read operation ("No" from operation S20b), in operation S20c, the memory chip 100a/200a/300a may determine whether an error associated with the PIM operation occurs.

When it is determined that the error associated with the PIM operation occurs ("Yes" from operation S20c), in operation S30c, the memory chip 100a/200a/300a may output event data corresponding to the error to the memory controller 20/40.

The error associated with the PIM operation may mean a case where the operator included in the PIM instruction set PIMIS does not coincide with the command CMD received from the memory controller 20/40 or a register corresponding to the PIM address does not exist.

An embodiment in which the memory chip 100a/200a/300a receives the command CMD and the address ADDR from the memory controller 20/40 once is described with reference to FIG. 11.

With regard to the command CMD and the address ADDR received once, the memory chip 100a/200a/300a may output (e.g., immediately output) an error associated with the command and address data (CMD, ADDR) to the memory controller 20/40 as the AERR signal.

However, with regard to the command CMD and the address ADDR received once, the memory chip 100a/200a/300a may fail to determine (e.g., may not determine immediately) the error during the data read operation corresponding to the command CMD and the address ADDR or the error associated with the PIM operation.

In this case, although not illustrated, with regard to a next command CMD and the address ADDR received from the memory controller 20/40, the memory chip 100a/200a/300a may determine an error during the data read operation or an error associated with the PIM operation.

In response to the next command CMD and the address ADDR received from the memory controller 20/40, the memory chip 100a/200a/300a may output event data corresponding to the error during the data read operation or the error associated with the PIM operation to the memory controller 20/40 as the AERR signal.

Figure 12:
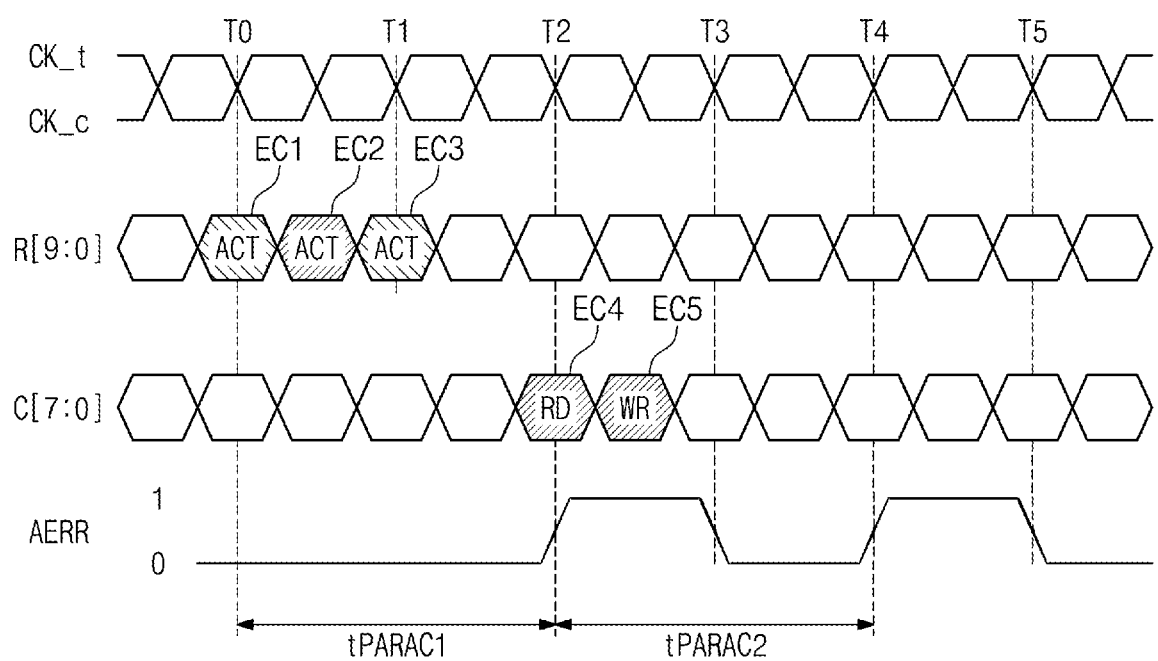
FIG. 12 is a timing diagram illustrating an address error signal output through an address error pin.

FIG. 12 is a timing diagram illustrating an AERR signal output through an AERR pin. In some embodiments, in FIG. 12, CK_t means a first clock signal, and CK_c means a second clock signal complementary to the first clock signal. T0 to T5 mean points in time at which logical values of the first clock signal and the second clock signal change. A parity active period tPARAC means a time interval in which the parity check is performed based on command and address data and parity bits.

Referring device FIGS. 1, 3, and 12, the memory chip 100a/300a may perform the parity check based on the parity bits and the command and address data received from the memory controller 20/40.

The memory chip 100a/300a may check an error of the command and address data and an error during the PIM operation through the parity check and may report the error to the host 10/30 after the parity active period tPARAC based on an incorrect parity check result.

The parity active period tPARAC may have a time interval corresponding to two cycles of the clock signals. For example, a first parity active period tPARAC1 may include a first period from T0 to T1 and a second period from T1 to T2. A second parity active period tPARAC2 may include a third period from T2 to T3 and a fourth period from T3 to T4.

R[9:0] means that row command and address data are transferred through an R pin in units of 10 bits. For example, the row command may include the active command ACT.

C[7:0] means that column command and address data are transferred through a C pin in units of 8 bits. For example, the column command may include the read command RD and the write command WR. However, the number of data bits transferred through each of the R pin and the C pin is not limited thereto.

The memory chip 100a/300a may receive the active command ACT from the memory controller 20/40 through the R pin at the point in time T0.

When the receiving the active command ACT at the point in time T0, the memory chip 100a/300a may determine whether an error occurs in the memory chip 100a/300a, through the parity check. The memory chip 100a/300a may store a first determination result EC1 associated with whether an error occurs.

The memory chip 100a/300a may receive the active command ACT from the memory controller 20/40 through the R pin at a middle point in time of the first period from T0 to T1.

When the receiving the active command ACT at the middle point in time, the memory chip 100a/300a may determine whether an error occurs in the memory chip 100a/300a, through the parity check. The memory chip 100a/300a may store a second determination result EC2 associated with whether an error occurs.

The memory chip 100a/300a may receive the active command ACT from the memory controller 20/40 through the R pin at the point in time T1.

When the receiving the active command ACT at the point in time T1, the memory chip 100a/300a may determine whether an error occurs in the memory chip 100a/300a, through the parity check. The memory chip 100a/300a may store a third determination result EC3 associated with whether an error occurs.

In some embodiments, in FIG. 12, the second determination result EC2 may include information about an incorrect parity check result. Each of the first determination result EC1 and the third determination result EC3 may include information about a correct parity check result.

In this case, after the first parity active period tPARAC1, the memory chip 100a/300a may send the AERR signal changing from "0" to "1" to the memory controller 20/40 based on the second determination result EC2. The event data may mean the AERR signal whose value is "1".

The memory chip 100a/300a may receive the read command RD from the memory controller 20/40 through the C pin at the point in time T2.

When receiving the read command RD at the point in time T2, the memory chip 100a/300a may determine whether an error occurs in the memory chip 100a/300a, through the parity check. The memory chip 100a/300a may store a fourth determination result EC4 associated with whether an error occurs.

The memory chip 100a/300a may receive the write command WR from the memory controller 20/40 through the C pin at a middle point in time of the second period from T2 to T3.

When receiving the write command WR at the middle point in time, the memory chip 100a/300a may determine whether an error occurs in the memory chip 100a/300a, through the parity check. The memory chip 100a/300a may store a fifth determination result EC5 associated with whether an error occurs.

In some embodiments, in FIG. 12, each of the fourth determination result EC4 and the fifth determination result EC5 may include information about an incorrect parity check result.

In this case, after the second parity active period tPARAC2, the memory chip 100a/300a may send the AERR signal changing from "0" to "1" to the memory controller 20/40 based on the fourth determination result EC4 and the fifth determination result EC5. The event data may mean the AERR signal whose value is "1".

According to some embodiments of the present disclosure, memory devices that report various event data associated with errors occurring when performing in-memory processing in various schemes, electronic devices including the memory devices, and operating methods of the memory devices may be provided. As such, a memory device according to the present disclosure may report the event data to a host relatively quickly, and the reliability and availability of the memory device may be improved.

While the present disclosure has been described with reference to some examples of embodiments thereof, it will be apparent to those of ordinary skill in the art that various changes and modifications may be made thereto without departing from the spirit and scope of the present disclosure as set forth in the following claims.

What is claimed is:

1. A memory device comprising:
   a plurality of memory chips, each of the plurality of memory chips including a plurality of memory banks, wherein each of the plurality of memory banks includes:
     a memory cell array including a plurality of memory cells connected with a plurality of word lines and a plurality of bit lines;
     a row decoder connected with the memory cell array through the plurality of word lines;
     a sense amplifier and write driver connected with the memory cell array through the plurality of bit lines; and
     a column decoder connected with the sense amplifier and write driver;
   a plurality of error correction code blocks respectively connected with the plurality of memory banks;
   a logic circuit connected with the plurality of error correction code blocks, and configured to perform a read operation on data stored in the plurality of memory banks based on a first command and a first address received from a host; and
   a log register connected with the logic circuit via first channels,
   wherein, when a processing in memory (PIM) instruction set is stored prior to receipt of the first command and the first address, the logic circuit is configured to perform a PIM command execution operation,
   wherein, when an error associated with the PIM command execution operation occurs, the logic circuit is configured to generate error data and record the error data at the log register via the first channels,
   wherein, in a first operation mode, the logic circuit is configured to output, via a memory controller and second channels, both data stored in memory cells of the plurality of memory banks corresponding to the first address and event data indicating an existence of the error data to the host in response to a second command and a second address, and
   wherein, in a second operation mode, the logic circuit is configured to output the event data to the host via the memory controller and third channels in response to generation of the error data.

2. The memory device of claim 1, wherein the logic circuit includes an address generator,
   wherein, when the PIM instruction set is stored, the address generator is configured to generate a PIM address based on the first address,
   wherein the PIM command execution operation includes a PIM read operation for data stored in memory cells of the plurality of memory banks, the memory cells corresponding to the PIM address, and
   wherein, when the plurality of error correction code blocks generate an error correction fail code during the PIM read operation, the logic circuit is configured to generate an error data that includes the error correction fail code.

3. The memory device of claim 2,
   wherein, in the first operation mode, the logic circuit is configured to output the data of the memory cells and the event data indicating the existence of the error data to the host in response to the second command and the second address.

4. The memory device of claim 2, wherein the logic circuit is configured to generate the error data such that the error data includes an address error in response to a determination that an error is present in the first address, and
   wherein, in the first operation mode, the logic circuit is configured to output the data of the memory cells and the event data indicating the existence of the error data to the host in response to the second command and the second address.

5. The memory device of claim 2, wherein, when a PIM instruction set corresponding the first command and the first address is not stored, the logic circuit is configured to perform the read operation on data of memory cells corresponding to the first command and the first address, generate the error data such that the error data includes a PIM instruction set error, and
   wherein, in the first operation mode, the logic circuit is configured to output the data of the memory cells and the event data indicating the existence of the error data to the host in response to the second command and the second address.

6. The memory device of claim 2, wherein the logic circuit is configured to generate the error data such that the error data includes a register error in response to determining that an error is present in a register corresponding to the PIM address from among a plurality of registers included in a register file, and
   wherein, in the first operation mode, the logic circuit is configured to output the data of the memory cells and the event data indicating the existence of the error data to the host in response to the second command and the second address.

7. The memory device of claim 1, wherein the logic circuit is configured to generate the error data including an address error in response to determining that an error is present in the first address.

8. The memory device of claim 1, wherein, when a PIM instruction set corresponding the first command and the first address is not stored, the logic circuit is configured to perform the read operation on data of memory cells corresponding to the first command and the first address and generate the error data including a PIM instruction set error.

9. The memory device of claim 1, wherein the logic circuit includes:
   an address generator; and
   a register file including a plurality of registers,
   wherein, when the PIM instruction set is stored, the address generator is configured to generate a PIM address based on the first address, and
   wherein the logic circuit is configured to generate the error data such that the error data includes a register error in response to determining that an error is present in a register of the plurality of registers that corresponds to the PIM address.

10. The memory device of claim 1, wherein, in the second operation mode, the logic circuit is configured to output the error data to the host through third channels in response to generation of the error data.

11. The memory device of claim 1, wherein the logic circuit includes an address generator,
wherein, when the PIM instruction set is stored, the address generator is configured to generate a PIM address based on the first address,
wherein the PIM command execution operation includes a PIM read operation for data stored in memory cells corresponding to the PIM address from among the data stored in the plurality of memory banks,
wherein, when the plurality of error correction code blocks is configured to generate an error correction fail code during the PIM read operation, the logic circuit is configured to generate the error data such that the error data includes the error correction fail code.

12. The memory device of claim 1, wherein the logic circuit is configured to generate the error data such that the error data includes an address error in response to determining that an error is present in the first address.

13. The memory device of claim 1, wherein, when a PIM instruction set corresponding the first command and the first address is not stored, the logic circuit is configured to perform the read operation on data of memory cells corresponding to the first command and the first address, and generate the error data such that the error data includes a PIM instruction set error.

14. An operating method of a memory device which includes a plurality of memory chips each including a plurality of memory cells, the method comprising:
receiving, at a logic circuit included in a memory chip, a first command and a first address;
when a processing in memory (PIM) instruction set is stored in the logic circuit before receiving the first command and the first address:
generating, at the logic circuit, a PIM address based on the first address;
performing, at the logic circuit, a PIM read operation on data of memory cells corresponding to the PIM address from among the plurality of memory cells;
performing, at the logic circuit, a PIM calculation operation based on the data of the memory cells;
when an error associated with at least one of the first address, the PIM read operation or the PIM calculation operation occurs, generating, at the logic circuit, error data and recording the error data at a log register via first channels;
outputting, at the logic circuit, both data stored in memory cells of the plurality of memory banks corresponding to the first address and event data indicating an existence of the error data to a host via a memory controller and second channels in response to a second command and a second address, in a first operation mode; and
outputting, at the logic circuit, the event data to the host via the memory controller and third channels in response to generating the error data, in a second operation mode.

15. The method of claim 14, wherein in the performing of the PIM read operation an error correction code block included in the memory chip generates an error correction fail code, the method further comprising:
generating, at the logic circuit, the error data such that the error data includes the error correction fail code; and
outputting, at the logic circuit, the data of the memory cells and the event data indicating the existence of the error data to the host in response to the second command and the second address, in the first operation mode.

16. The method of claim 14, wherein in the receiving of the first address the logic circuit determines that an error is present in the first address, the method further comprising:
generating, at the logic circuit, the error data such that the error data includes an address error; and
outputting, at the logic circuit, the data of the memory cells and the event data indicating the existence of the error data to the host in response to the second command and the second address, in the first operation mode.

17. The method of claim 14, wherein in the receiving of the first command and the first address the logic circuit determines that a PIM instruction set corresponding to the first command and the first address is not stored, the method further comprising:
generating, at the logic circuit, the error data such that the error data includes a PIM instruction set error; and
outputting, at the logic circuit, the data of the memory cells and the event data indicating the existence of the error data to the host in response to the second command and the second address, in the first operation mode.

18. The method of claim 14, wherein the performing of the PIM read operation includes performing a read operation on data of a register corresponding to the PIM address, and
wherein the logic circuit determines that an error is present in the register corresponding to the PIM address, the method further comprising:
generating, at the logic circuit, the error data such that the error data includes a register error; and
outputting, at the logic circuit, the data of the memory cells and the event data indicating the existence of the error data to the host in response to the second command and the second address, in the first operation mode.

19. An electronic device comprising:
a plurality of memory devices; and
a memory controller configured to receive a command and an address from an external host and configured to transfer the command and the address to the plurality of memory devices,
wherein each of the plurality of memory devices includes a plurality of memory chips, wherein each of the plurality of memory chips includes a plurality of memory banks, and wherein each of the plurality of memory banks includes:
a memory cell array including a plurality of memory cells connected with a plurality of word lines and a plurality of bit lines;
a row decoder connected with the memory cell array through the plurality of word lines;
a sense amplifier and write driver connected with the memory cell array through the plurality of bit lines; and
a column decoder connected with the sense amplifier and write driver;
a plurality of error correction code blocks respectively connected with the plurality of memory banks;
a logic circuit connected with the plurality of error correction code blocks, and configured to perform a read operation on data stored in the plurality of memory banks based on the command and the address received from the external host; and a log register connected with the logic circuit via first channels, wherein, when a processing in memory (PIM) instruction set is stored before the command and the address are received, the logic circuit is configured to perform a PIM command execution operation, wherein, when an error associated with the PIM command execution operation occurs, the logic circuit is configured to generate error data and record the error data at the log register via the first channels, wherein, in a first operation mode, the logic circuit is configured to output both data stored in memory cells of the plurality of memory banks corresponding to the first address and event data indicating an existence of the error data to the external host via the memory controller and second channels in response to a second command and a second address, and wherein, in a second operation mode, the logic circuit is configured to output the event data to the external host via the memory controller and third channels in response to generating the error data.

20. The electronic device of claim 19, wherein the logic circuit includes an address generator, wherein, when the PIM instruction set is stored, the address generator is configured to generate a PIM address based on the address, and wherein the PIM command execution operation includes a PIM read operation for data stored in memory cells in the plurality of memory banks that correspond to the PIM address, wherein, in the first operation mode, the logic circuit is configured to output the data of the memory cells and the event data to the external host in response to the second command and the second address, wherein, in the second operation mode, the logic circuit is configured to output the event data to the external host in response to generation of the error data, and wherein the error data includes information about at least one of:

an error correction fail code which the logic circuit receives from the plurality of error correction code blocks;

an error of the address which the logic circuit receives from the external host; or a PIM instruction set error that is a response to a determination that a PIM instruction set corresponding to the command and the address is not stored.

* * * * *